United States Patent [19]

Iino et al.

[11] Patent Number: 5,792,255
[45] Date of Patent: Aug. 11, 1998

[54] MANUFACTURING METHOD OF SINGLE CRYSTAL

[75] Inventors: Eiichi Iino; Kiyotaka Takano; Masanori Kimura; Hirotoshi Yamagishi, all of Gunma-ken, Japan

[73] Assignee: Shin-Etsu Handotai Co., Ltd., Tokyo, Japan

[21] Appl. No.: 655,201

[22] Filed: May 30, 1996

[30] Foreign Application Priority Data

Jun. 1, 1995 [JP] Japan .................... 7-158454

[51] Int. Cl.$^6$ .................................. C30B 15/22
[52] U.S. Cl. ................ 117/32; 117/15; 117/30; 117/217; 117/917
[58] Field of Search .................. 117/13, 15, 30, 117/32, 200, 217, 222, 900, 917

[56] References Cited

U.S. PATENT DOCUMENTS

| 4,565,672 | 1/1986 | Matsutani et al. ............ 117/217 |
| 4,708,764 | 11/1987 | Boden et al. ............... 117/15 |

FOREIGN PATENT DOCUMENTS

| 362171986A | 7/1987 | Japan ............ 117/32 |
| A-2143746 | 2/1985 | United Kingdom. |
| A-2 144 338 | 6/1985 | United Kingdom. |
| A-2 163 672 | 3/1986 | United Kingdom. |
| WO-A-8908731 | 9/1989 | WIPO. |

*Primary Examiner*—Felisa Garrett
*Attorney, Agent, or Firm*—Ronald R. Snider

[57] ABSTRACT

In a single crystal manufacturing method by a horizontal magnetic field applied CZ method wherein coils are disposed interposing a crucible coaxially with each other, the coils constituting superconductive electromagnets of a magnetic field application apparatus and the silicon crystal is pulled from melt in the crucible while applying a horizontal magnetic field to the melt; an elevation apparatus capable of finely adjusting relative positions of the superconductive electromagnets and the crucible in a vertical direction is disposed. The descent of a central portion Cm in a depth direction of the melt is canceled by elevating the crucible with the elevating apparatus, the descent being accompanied with proceeding of process of pulling the single crystal, thereby a coil central axis Cc of the superconductive electromagnets always passes through the central portion Cm or below this portion. Compared with the conventional HMCZ method, an uniformity of an intensity distribution of the magnetic field applied to the melt is increased so that a suppression effect on the melt convection all over the crucible is enhanced.

3 Claims, 4 Drawing Sheets

1

MANUFACTURING METHOD OF SINGLE CRYSTAL

The present disclosure relates to subject matter contained in Japanese patent application No. 158454 / 1995 (filed on Jun. 1, 1995) which is expressly incorporated herein by reference in its entirety.

BACKGROUND OF THE INVENTION

1. Field of the Invention

The present invention relates to a manufacturing method of a single crystal and an apparatus of manufacturing the same, more particularly to a horizontal magnetic field applied CZ method (hereinafter referred to as a HMCZ method) wherein while applying a horizontal magnetic field to a raw material melt in a crucible with a magnetic field application apparatus, a single crystal is pulled from the melt, and an apparatus suitable for carrying out this manufacturing method.

2. Description of the Prior Art

It has been well known that the foregoing HMCZ method is superior to an ordinary Czochralski method (hereinafter referred to as a CZ method) in various respects. An apparatus used for the execution of the HMCZ method is an improvement of the apparatus used in the ordinary CZ method, wherein a pair of magnetic field application apparatuses, each comprising an electromagnet such as a superconductive magnet, are disposed facing each other interposing a crucible in the outside of a heater for heating the crucible.

When a silicon single crystal is, for example, pulled from a silicon melt in a quartz crucible, the thermal convection of the silicon melt is suppressed according to the HMCZ method, and the fluctuations of a temperature with time in the surface portion of silicon melt (temperature of interface between solid and liquid) is greatly reduced, and, at the same time, a dissolution amount of SiO from the crucible is reduced. As a result, the generation of defects and dislocations is suppressed, and, moreover, the silicon single crystal with uniformity and low oxygen concentration can be easily obtained.

U.S. Pat. No. 4,565,671 discloses an example of a single crystal manufacturing apparatus using the HMCZ method. This apparatus is designed such that the central axis of a superconductive coil is in accord with the surface of the melt in the quartz crucible so that the thermal convection near the surface of the melt is suppressed and the thermal convection area is formed below the vicinity of the surface of the melt.

In this apparatus, the heat transfer to the interface layer between the single crystal during being pulled and the melt is enhanced so that the temperature difference between the crucible periphery and the aforementioned interface layer can be reduced. At the same time, the melt which is fully agitated below the vicinity of the surface thereof, is supplied to the aforementioned interface. Therefore, the single crystal with the more uniform property compared to that obtained by the apparatus according to the ordinary CZ method can be grown. In addition, the crack of the crucible produced by thermal stress can be prevented.

There are two subjects to be solved on the single crystal growth technique required for the recent single crystal, especially for silicon single crystal, of a large diameter. One is a low oxygen concentration, and the other is an increase in productivity owing to a stable crystal growth. Recent years, the device manufacturing processes have been conducted in cleaner environment than before so that the necessity for the gettering effect for heavy metal impurities within the wafer is lessened. Therefore, the demand for a single crystal of a low oxygen concentration has been increased.

However, as the diameter of the single crystal becomes larger, the diameter of the quartz crucible used for the growth the single crystal becomes larger. As a result, the dissolution amount of the inner surface layer of the crucible to the melt in the crucible increases so that the oxygen concentration in the melt becomes higher. Thus, the oxygen concentration in the single crystal of a large diameter is liable to be high compared to that of a small diameter obtained by a small-sized crucible. As factors that the dissolution amount of the quartz crucible inner surface into the melt increases as the diameter of the single crystal becomes larger, (a) the increase in a friction force, when the crucible rotates, due to the tendency of the weight of the melt to grow larger, (b) the increase in the heating amount required for heating the crucible accompanied with the tendency of the crucible diameter to grow larger, and (c) the increase in the melt convection in the melt due to the increase of temperature difference in the melt are given. Therefore, to reduce the oxygen concentration in the single crystal of a large diameter, it is very essential to suppress the convection of the melt in the crucible.

In the manufacturing apparatus of the single crystal disclosed in the foregoing United States Patent, however, the uniformity of the horizontal magnetic field applied to the melt is not necessarily satisfactory. Therefore, the suppression effect on the melt convection in the crucible is not necessarily sufficient. For this reason, when the silicon single crystal of the diameter larger than 8 inch is pulled, there has been a drawback that it is difficult to obtain the product with an uniformly low oxygen concentration and less defects.

Furthermore, in the manufacturing apparatus of the single crystal disclosed in the foregoing United States Patent, though the convection in the vicinity of the surface of the melt in the crucible is suppressed, the apparatus is designed such that the thermal convection under the vicinity of the surface is present. Therefore, the convection at the lower portion of the crucible is large likewise the conventional apparatus, so that the dissolution and corrosion of the quartz crucible proceed excessively and the lifetime of the crucible is shortened.

SUMMARY OF THE INVENTION

The present invention was made considering the foregoing problems. The object of the present invention is to enhance the suppression effect on the melt convection in the crucible and to manufacture the large diameter single crystal with the uniform and low oxygen concentration, and less defects, by improving the manufacturing method and apparatus of the single crystal according to the HMCZ method.

Another object of the present invention is to reduce the number of the crucibles used for pulling single crystal by prolonging the lifetime of the crucible, resulting in the reduction of the time required to replace the crucible.

According to a manufacturing method of a single crystal of the present invention, in a HMCZ method wherein a pair of coils constituting electromagnets, e.g., superconductive magnets of a magnetic application appratus are disposed interposing a crucible coaxially with each other, and a single crystal is pulled from a raw material melt in the crucible while applying a horizontal magnetic field to the melt, the improvement wherein the vertical positions of the electromagents relative to the crucible are determined such that central axes of the coils constituting the electromagnets pass through the central portion of the melt in the depth direction thereof or the portion lower than the central portion thereof.

In the manufacturing method of the single crystal according to the present invention, the single crystal should be preferably pulled while keeping the distance in a horizontal direction between the electromagenet and the crucible constant. Furthermore, the variation width of the horizontal magnetic field intensity in the depth direction of the melt should be desirably controlled within the range of 0.8 to 1.2 times as wide as the average value of the horizontal magnetic field intensity in the depth direction of the melt on all of lines perpendicular to the surface of the melt, more preferably, 0.85 to 1.15 times.

The manufacturing method of the single crystal according to the present invention is not limited to the single crystal pulling method in a batch process according to the ordinary CZ method, and is also applicable to a single crystal pulling method according to a so-called Recharge CZ (RCCZ) method or a Continuous Charging (CCCZ) method.

In the RCCZ method, without solidifying a residual melt in a crucible after completion of a single crystal growth, pulling operations are repeated by refilling a raw material in the crucible so that a plurality of single crystal rod can be grown sequentially from the same crucible in the batch process.

In the CCCZ method, either a raw material melt or a granular polycrystalline raw material is charged in a crucible continuously. By keeping the amount of a melt in the crucible constant, the single crystal growth is continuously performed (see "Semiconductor Silicon Crystal Technology" Fumio SHIMURA, Published by Maruzen).

To execute the present invention following the RCCZ method, the foregoing horizontal magnetic field application apparatus may be attached to the conventional puller according to the RCCZ method.

To execute the present invention following the CCCZ method, the foregoing horizontal magnetic field application apparatus may be attached to the conventional pullar according to the CCCZ method.

When a manufacturing method of a single crystal according to the present invention is executed following the ordinary CZ or RCCZ method, in order to set the positions of electromagnets relative to a crucible so that coil central axes of the electromagnets pass through the central portion in a depth direction of melt in the crucible, after the positions of the electromagnets relative to the crucible to the crucible in a vertical direction are set at the beginning of growing a single crystal so that coil central axes of the electromagnets pass through the above central portion, and by elevating the crucible continuously, the descent of the aforementioned central portion of the melt accompanied with the pulling of the single crystal should be canceled.

It is noted that in the foregoing canceling operation, the electromagnets may be descended continuously on behalf of the elevation of the crucible. Furthermore, when the manufacturing method of the single crystal according to the present invention is applied to the CCCZ method, the foregoing operation is unnecessary because of the constant height of the melt surface in the CCCZ method.

In order to suppress the melt convection in the crucible following the HMCZ method, it is important that the magnetic field having as high uniformity and intensity as possible should be applied to the whole of the melt by disposing the melt in the crucible in the magnetic field of a gentle intensity gradient and a high intensity. To accomplish this, it is effective that the electromagnet of a large coil diameter Rc (see FIG. 1) capable of producing the high intensity electric field is disposed at a position far distant from the crucible.

According to a manufacturing apparatus of a single crystal of the present invention, in a single crystal manufacturing apparatus used for the horizontal magnetic field application CZ method wherein coils constituting electromagnets, e.g., superconductive magnets, of a magnetic field application apparatus are disposed interposing a crucible coaxially with each other, and the single crystal is pulled from a raw material melt in the crucible while applying a horizontal magnetic field to the melt, the improvement wherein an elevating mechanism is disposed which is capable of finely adjusting the vertical position of the aforementioned electromagnet relative to the aforementioned crucible.

In the single crystal manufacturing apparatus of the present invention, the electromagnets should be preferably capable of producing a high intensity magnetic field, and the coil diameter Rc should be preferably three times as long as the depth of the melt in the crucible at the beginning of the single crystal growth. In addition, it is more preferable that the electromagnets which form the same intensity distribution of the magnetic field are disposed symmetrically with respect to a central axis of the crucible and at a far distance from the crucible.

The manufacturig apparatus of this invection will be described by using FIG. 1. In this apparatus, a pair of superconductive electromagnets 12 and 15 having the same specification are disposed symmetrically with respect to the central axisl of the crucible 2, and the vertical positions of the superconductive electromagnets relative to the crucible 2 is adjusted by the foregoing elevating mechanism (not shown), thereby during the processes of pulling the single crystal, the coil central axis Cc always passes through the the central portion Cm of the melt in the crucible 2 in the depth direction thereof or below the portion Cm. Specifically, the operation in the apparatus of the present invention differs simply from that in the conventional HMCZ method in that the apparatus of the present invention is controlled such that the foregoing coil central axis Cc passes through the foregoing central portion Cm or below the portion Cm.

In the processes of the single crystal growth, the isointensity line distribution of the magentic field formed by the superconductive electromagnets 12 and 15 is illustrated in FIG. 3. The intensity of the magnetic field applied to the melt 41 in the crucible decreases, as the distance of the portion of the melt from the superconductive electromagnets 12 and 15 increases. For instance, the magnetic field intensities at the curves 1a and 1c are 6000 Gauss, and the curves 1b and 1d, 4000 Gauss. For this reason, the magnetic field intensity applied to the melt 41a shown with the hatching is not more than 4000 Gauss, and the magnetic field intensity at the melt 41b other than the melt 41a is more than 4000 Gauss and not more than about 6000 Gauss. Strictly describing, the magnetic field intensity at the melt closest to the inner wall of the crucible 2 exceeds 6000 Gauss.

In this case, in the manufacturing apparatus of the single crystal, the superconductive electromagnets 12 and 15 of the same magnetic field intensity distribution are disposed symmetrically with respect to the crucible central axis 1 and at the positions far from the crucible 2, which is capable of generating the magnetic field of a high intensity and have the coil diameter Rc more than three times as long as the depth of the melt in the crucible at the beginning of pulling the single crystal. Thus, the ratio of the melt 41a shown with the hatching to the total amount of the melt can be greatly reduced. As a result, it is possible to place almost the total amount of the melt in the crucible at the magnetic field intensity ranging from 4000 to 6000 Gauss.

Therefore, according to the manufacturing apparatus of the single crystal of the present invention, an effective dynamic viscosity coefficient of the melt in the crucible is increased, and effective dynamic viscosity coefficients of all of the melt are practically equal so that the convection of the melt in the crucible can be effectively restrained. Hence, the variation in a temperature of the melt during the processes of pulling the single crystal is restrained. Furthermore, since the convection of the melt at the bottom of the crucible is effectively restrained, the disolution and corrosion of the crucible by the melt are hard to occur thereby the lifetime of the crucible is prolonged.

By keeping the horizontal distance between the aforementioned electromagnet and the aforementioned crucible constant, the changing with passage time of the intensity distribution of the magnetic field applied to the melt can be removed, so that the suppression effect on the melt convection in the crucible can be further increased.

The reason why the variation width of the horizontal magnetic field intensity in the depth direction of the melt in the crucible should be preferably controlled at the range of 0.8 to 1.2 times (more preferably, 0.85 to 1.15 times) as much as the average value of the horizontal magnetic field intensity in the depth direction of the melt on all of lines perpendicular to the surface of the melt is as follows. Specifically, when the superconductive electromagnet is used as the electromagnet and the magnetic field of the intensity of about 5000 Gauss is applied to the melt in the crucible, if it is considered that a great decrease in the electric power consumption efficieny and an increase in size of the manufacturing apparatus of the single crystal should be avoided, the desirable variation width of the horizontal magnetic field in the depth direction of the melt is in the foregoing range. If the variation width is in this range, the suppression effect on the melt convection is most enhanced.

BRIEF DESCRIPTION OF THE DRAWINGS

An embodiment of the present invention will now be described by way of example and with reference to the accompanying drawings, in which.

DETAILED DESCRIPTION OF THE PREFERRED EMBODIMENT

An embodiment of the present invention will be now described with reference to the accompanying drawings below.

EMBODIMENT I

Figure 1:
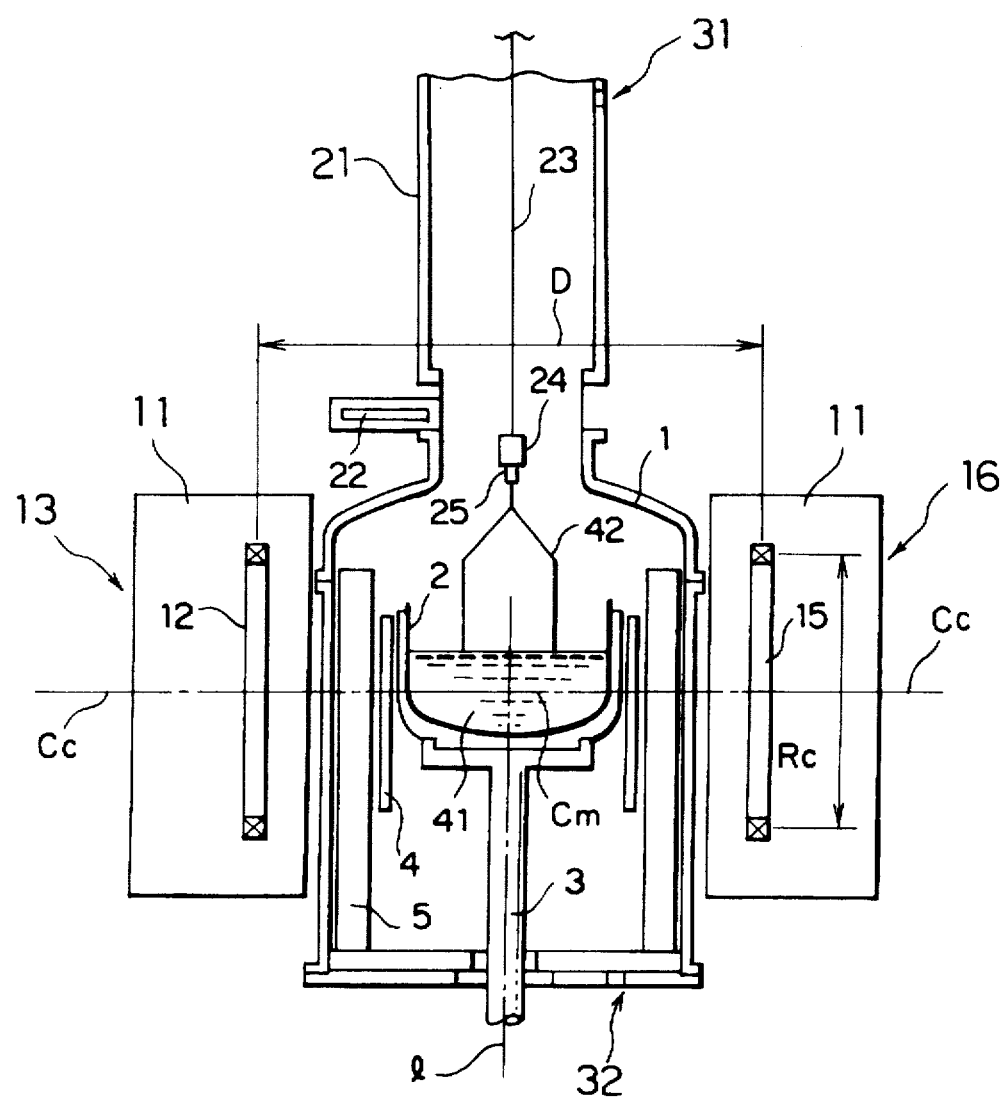
FIG. 1 is a diagrammatic vertical cross-sectional view showing a principal structure of an apparatus of manufacturing a single crystal according to an embodiment of the present invention.
Figure 2:
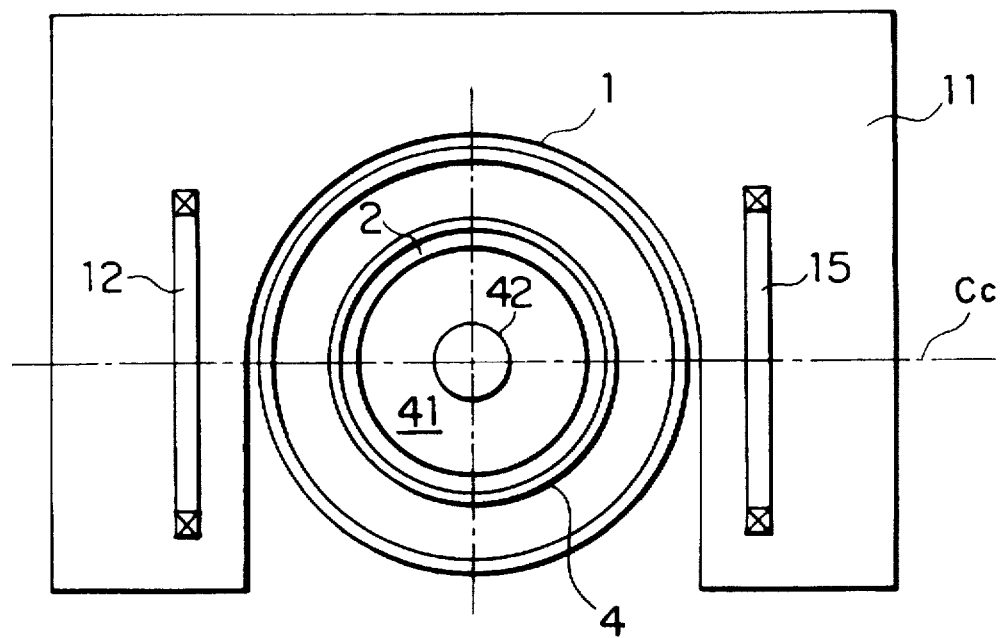
FIG. 2 is a horizontal cross-sectional view of FIG. 1.

FIG. 1 is a diagrammatic vertical cross-sectional view showing a principal structure of a silicon single crystal puller. FIG. 2 is a horizontal cross-sectional view of FIG. 1.

In this single crystal puller, a crucible 2 having an inner side formed of quartz and an outer side formed of graphite is supported, in a cylindrical chamber 1 formed of stainless steel, by a supporting shaft 3 extending in a vertical direction. A cylindrical heater 4 formed of a carbon material is disposed around the crucible 2, and a cylindrical heat insulator S formed of a carbon material is disposed around the heater 4. The heater 4 and the heat insulator 5 are fixed at their positions in vertical and horizontal directions.

The supporting shaft 3 is allowed to rotate together with the crucible 2 by a rotation driving mechanism (not shown and the number of its rotations can be finely adjusted. Furthermore, the supporting shaft 3 is allowed to move upward and downward by a sliding mechanism (not shown) comprising a control mechanism, the sliding mechanism corresponding to the foregoing elevating mechanism, and its positions in the up and down directions can be finely adjusted.

At the outside of the chamber 1, a magnetic field application apparatus 13 and a magnetic field application apparatus 15 are disposed symmetrically with respect to the central axis of the crucible 2. The magnetic field application apparatus 13 comprises a cooling container 11 and a superconductive electromagnet 12 accommodated in the container 11. The magnetic field application apparatus 15 comprises a cooling container 11 and a superconductive electromagnet 15 accommodated in the container 11. The distances from the crucible 2 and positions in the up and down directions of these superconductive electromagnets 12 and 15 are kept constant. The coil diameters Rc of the superconductive electromagnets 12 and 15 are three times as long as the depth of the melt in the crucible when the pulling of the single crystal is begun.

A cylindrical stainless pulling chamber 21 is arranged above the chamber 1, coaxially with the chamber 1 connected to the chamber 21. An isolation valve 22 is disposed at the connection portion of the chamber I and the pulling chamber 21. The pulling chamber 21 forms a space for accommodating the silicon single crystal pulled and for taking out it to the outside.

A winding up apparatus (not shown) for the silicon single crystal is arranged above the pulling chamber 21 such that it is capable of rotating around the vertical axis. A wire 23 is hung from the winding up apparatus, and a seed crystal 25 is attached to the lowermost part of the wire 23 by a seed crystal holder 24. An inlet 31 of inert gas such as Ar is formed in the upper portion of the pulling chamber 21, and an outlet 32 for inert gas is formed in the lower portion of the chamber 1. The outlet 32 is connected to a vacuum generator (not shown) such that the chamber 1 and the pulling chamber 21 are kept at a predetermined vacuum. It is noted that reference numeral 41 denotes a silicon melt, and 42, a silicon single crystal during being pulled.

When growing the silicon single crystal, the positions of the superconductive electromagnets 12 and 15 relative to the crucible 2 in the up and down directions is determined by the foregoing sliding mechanism before starting the pulling of the single crystal, such that the central axis Cc of the magnets 12 and 15 passes through the central portion Cm in the depth direction of the melt 41 or passes through below the central portion Cm. Then, the superconductive electromagnets 12 and 15 are operated and the heater 4 starts to heat the side wall of the crucible 2. Subsequently, the seed crystal 25 attached to the seed crystal holder 24 is immersed in the surface of the melt 41, inert gas such as Ar is supplied to the surface of the melt 41, and the crucible 2 is rotated. At the same time, the seed crystal 25 is pulled upwardly while rotating the seed crystal 25, so that a neck, a cone, a shoulder, and a main body are sequentially grown.

As the growing of the single crystal proceeds, the depth of the melt 41 is reduced, so that the foregoing central portion Cm falls gradually. For this reason, in this embodiment, the crucible 2 is continuously elevated by the foregoing sliding mechanism thereby the fall of the central portion Cm can be canceled. By the above operation, the superconductive electromagnets 12 and 15 are regulated such that the coil central axis Cc always passes through the central portion Cm or below the portion Cm.

Testing Example I

Next, a pulling test of a silicon single crystal by a batch process executed according to the foregoing manner, which uses the apparatus of FIG. 1, will be described. (1) Specification of the puller:

I. an inner diameter of the crucible 2: 600 mm

II. a depth of the crucible 2: 400 mm

III. an outer diameter of the heater 4: 750 mm

IV. coil diameters Rc of the superconductive electromagnets 12 and 15: 840 mm

V. a distance D between the superconductive electromagnets 12 and 15: 1500 mm (2) Pulling conditions:

I. a diameter × a length of the silicon single crystal (a main body) to be obtained: 8 inch × 1.2 m, 9 inch × 1 m II. the number of rotations of the crucible 2: 0.6 rpm (constant)

III. the number of rotations of the seed crystal: 15 rpm (constant and rotated in an opposite direction to the crucible)

IV. a depth of the melt 41 in the crucible 2 at the beginning of the pulling of the single crystal: 260 mm V. the others: keep the pressure in the chamber 1 at not more than 300 mbar while supplying a suitable amount of inert gas (Ar)

Figure 3:
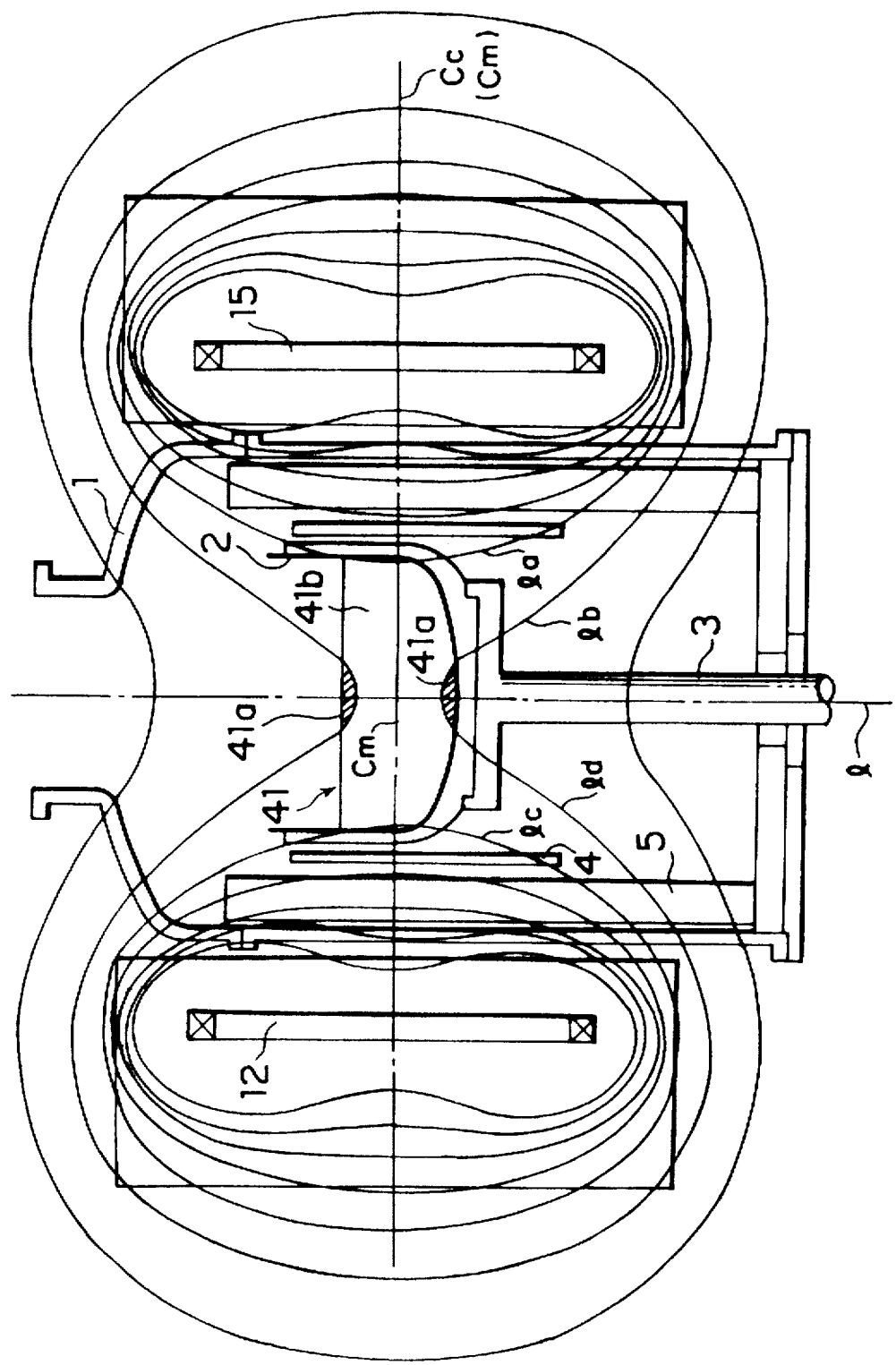
FIG. 3 is an isointensity line distribution of a magnetic field in a testing example 1, with a partly vertical cross-sectional view of the apparatus in FIG. 1.

An isointensity line distribution of the magnetic field formed by the superconductive electromagnets 12 and 15 is shown in FIG. 3. The isointensity line distribution was not varied all over the processes of the pulling of the single crystal. The right and left contour lines of the melt 41a were in accord with the isointensity line at 4000 Gauss of the magnetic field. Most of the other melt 41b were present between the isointensity line at 4000 Gauss of the magnetic field and the isointensity line at 6000 Gauss thereof. As a result, the intensitiy of the magnetic field applied to the melt 41a was not more than 4000 Gauss, and the intensity of the magnetic field applied to the melt 41b was more than 4000 and not more than about 6000 Gauss. Furthermore, the ratio of the volume of the melt 41a to the volume of the whole melt could be greatly reduced.

The ratio of the amount of the melt shown by hatching to the amount of the whole melt can be greatly reduced all over the pulling process of the single crystal by the foregoing puller and the foregoing pulling method. Most of the whole melt in the crucible can be located at the magnetic field of the intensity 4000 to 6000 Gauss. Though the suppression effect on the melt convection 41a is somewhat inferior to that in the portion 41b, the magnetic field intensity of the melt 41a is not lowered so much. In addition, the ratio of the melt 41a to the melt 41b is small. Therefore, the deterioration of the crucible due to the melt convection can be suppressed. This gives an advantage that the crucible can be used for long time with the application of the present invention to the RCCZ method or the CCCZ method.

The silicon single crystals of 8 and 9 inch diameters obtained in the test example I had an oxygen concentration of about 10 ppma (JEIDA), and a large diameter silicon single crystal having a very low oxygen concentration compared to the conventional HMCZ method could be obtained. Furthermore, these silicon single crystal had an oxygen concentration with a high uniformity in radial direction. The microscopic uniformity in the direction of the single crystal growth axis good.

Comparative Example I

Figure 4:
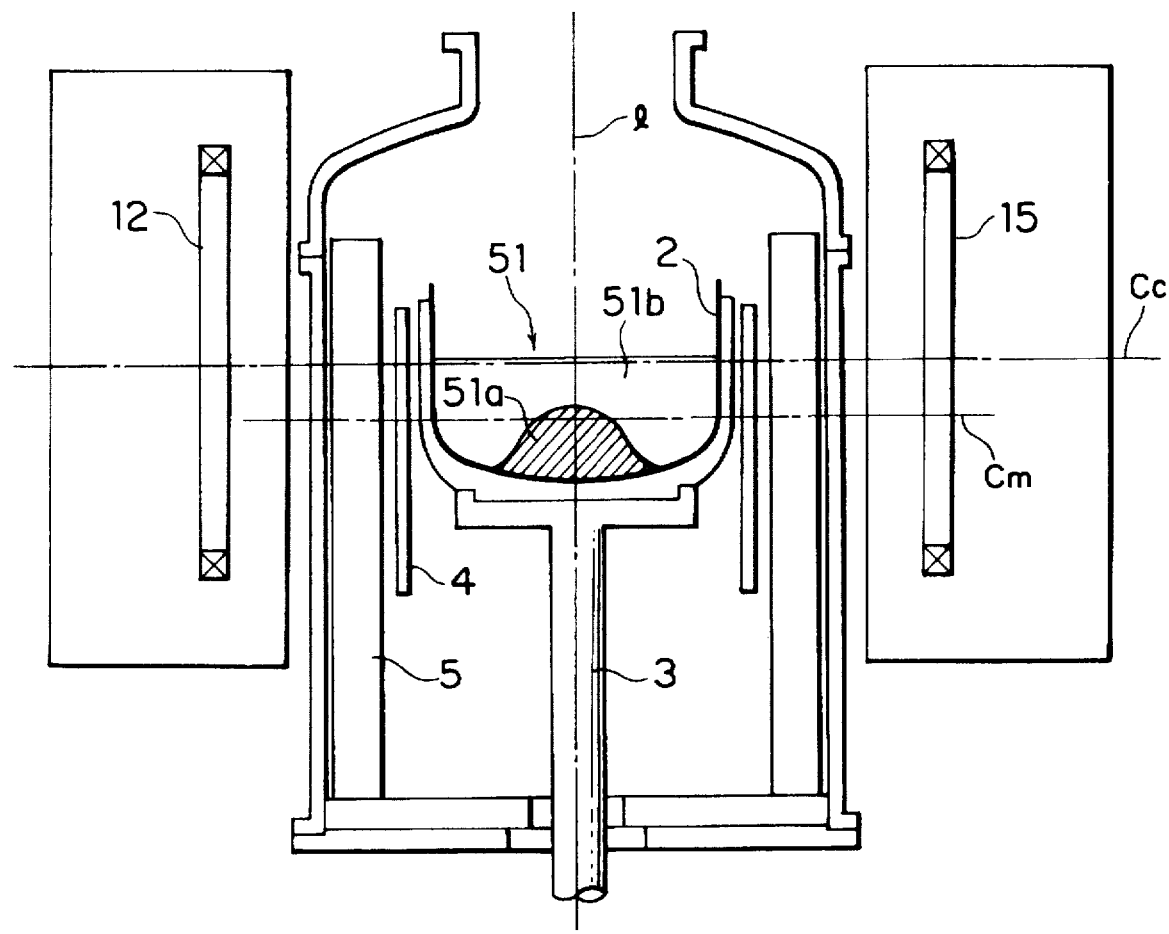
FIG. 4 is an explanatory diagram showing a melt located at a magnetic field not more than 4000 Gauss in the comparative example 1, and corresponds to FIG. 3.

Next, in this comparative example I the apparatus of FIG. 1 was used. The comparative example I was different from the testing example I only in that the coil central axis Cc of the superconductive electromagnets 12 and 15 was disposed just below the surface of the silicon melt 51 and close to the surface of the silicon melt, during all of the process of the pulling of the silicon single crystal. On the above condition, the silicon single crystal of the same dimension as that of the testing example I was grown. The magnetic field applied to the melt 51 is shown in FIG. 4. FIG. 4 is prepared using partly the isointensity line distribution of the magnetic field.

According to this method, during all of the process of the growth of the single crystal, the ratio of the hatched melt 51a, which was close to the central axis of the crucible 2, to the total amount of the whole melt was considerably larger compared with the testing example 1 as shown in FIG. 4. However, also in this case, the intensity of the magnetic field applied to the melt 51a was not more than 4000 Gauss, and the intensity of the magnetic field applied to the melt 51b other than the melt 51a was more than 4000 Gauss and not more than about 6000 Gauss.

In this pulling apparatus and method, since it was impossible to reduce the ratio of the hatched melt to the whole melt, it was impossible to dispose most of the whole melt in the crucible at the range of the magnetic field intensity ranging from 4000 to 6000 Gauss, unlike the testing example I. Furthermore, the ratio of the hatched melt 51a where the magnetic field is weak has been large, and the magnetic field intensity in the vicinity of the center of the portion where the magnetic field is weak has been small compared with the foregoing testing example I, so that the deterioration of the crucibe due to the convection of the melt has been large and the number of the crucibles used for the pulling of the single crystal has been increased. Therefore, the application of the apparatus of the comparative example I to the RCCZ method and the CCCZ method produces the problems.

The silicon single crystals of 8 and 9 inch diameters obtained in the comparative example I had an oxygen concentration of about 13 ppma (JEIDA). The uniformity of the oxygen concentration in radial direction of these single crystals and the microscopic uniformity in the direction of the single crystal grows axis were inferior.

As is clear from the above description, according to a manufacturing method of a single crystal of the present invention, in a HMCZ method wherein coils constituting electromagnets of magnetic application apparatus are disposed interposing a crucible coaxially with each other, and a single crystal is pulled from the raw material melt in the crucible while applying a horizontal magnetic field to the melt, the improvement wherein the vertical positions of the electromagents relative to the crucible are determined such that the central axes of the coils constituting the electromagnets passes through the central portion of the melt in the depth direction thereof or the portion lower than the central portion thereof. According to the present invention, the magnetic field of a narrow intensity range can be applied to most of the whole melt in the crucible all over the process of the single crystal growth. In other words, compared with the conventional HMCZ method, the uniformity of the intensity distribution of the magnetic field applied to the melt in the crucible can be enhanced.

As a result, the suppression effect on the melt convection in the crucible is remarkably raised, and the single crystal of a large diameter with less defects can be stably manufactured.

Furthermore, since the melt convection at the bottom of the crucible is effectively retrained, the melt hardly corrodes the crucible thereby the lifetime of the crucible can be prolonged. Accordingly, the number of the crucibles needed for the amount of the pulled the single crystal can be reduced.

Furthermore, in the manufacturing apparatus of the single crystal of the present invention wherein coils constituting electromagnets of an electric field application apparatus are disposed interposing a crucible coaxially with each other, a single crystal is pulled from a raw material melt in the crucible while applying a horizontal magnetic field to the melt, the improvement wherein an elevating apparatus capable of finely adjusting the vertical position relative to the crucible is arranged, the descent of a central portion of the melt in the depth direction can be canceled by elevating the crucible with the elevating apparatus.

According to the present invention, the central axes of the coils of the electromagnets always passes through the central portion of the melt or below the central portion, during the processes of the single crystal growth.

What is claimed is:

1. In a manufacturing method of a single crystal by a horizontal magentic field applied CZ method wherein a pair of coils constituting electromagnets of a magnetic application apparatus are disposed interposing a crucible coaxial with each other, and the single crystal is pulled from a raw material melt in the crucible while applying a horizontal magnetic field to the melt; the improvement wherein vertical positions of the electromagents relative to said crucible are determined such that coil central axes of said electromagnets pass through a central portion of said melt in a depth direction thereof or a portion lower than the central portion thereof.

2. A manufacturing method of a single crystal according to claim 1, wherein a distance in a horizontal direction between said electromagnet and said crucible are kept constant.

3. A manufacturing method of a single crystal according to claim 1 wherein a variation width of a horizontal magnetic field intensity in a depth direction of the melt in said crucible is regulated within a range of 0.8 to 1.2 times as high as an average value of the intensity of magnetic field as measured from a too surface of the melt to a lowest position of the melt in the depth direction of the melt in the crucible on vertical lines normal to the top surface of the melt.

* * * * *